US011718926B2

(12) United States Patent
Chen

(10) Patent No.: US 11,718,926 B2
(45) Date of Patent: Aug. 8, 2023

(54) METHOD OF SINGLE CRYSTAL GROWTH BY CONTROLLING THE HEATING OF A SOURCE MATERIAL AND THE COOLING OF A BACKSIDE OF A LID

(71) Applicant: HON HAI PRECISION INDUSTRY CO., LTD., New Taipei (TW)

(72) Inventor: Chung-Yi Chen, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/448,895

(22) Filed: Sep. 27, 2021

(65) Prior Publication Data

US 2023/0059271 A1 Feb. 23, 2023

(30) Foreign Application Priority Data

Aug. 19, 2021 (TW) ................. 110130719

(51) Int. Cl.
*C30B 23/06* (2006.01)
*C30B 23/00* (2006.01)
*C30B 35/00* (2006.01)
*C30B 29/36* (2006.01)

(52) U.S. Cl.
CPC .......... *C30B 23/066* (2013.01); *C30B 23/005* (2013.01); *C30B 29/36* (2013.01); *C30B 35/00* (2013.01)

(58) Field of Classification Search
CPC ....... C30B 23/00; C30B 23/002; C30B 23/02; C30B 23/06; C30B 23/063; C30B 29/00; C30B 29/10; C30B 29/36; C30B 35/00; C30B 33/00; C30B 33/02

USPC ........ 117/84–86, 88–89, 105, 200–202, 204, 117/937, 951

See application file for complete search history.

(56) References Cited

U.S. PATENT DOCUMENTS

| 7,767,022 | B1 | 8/2010 | Gupta et al. |
| 8,747,982 | B2 | 6/2014 | Straubinger et al. |
| 2013/0269598 | A1* | 10/2013 | Chen ...................... C30B 33/02 117/86 |

FOREIGN PATENT DOCUMENTS

| CN | 100365173 | C | 1/2008 |
| CN | 102534805 | B | 8/2014 |
| CN | 102703973 | B | 3/2015 |
| CN | 112746317 | A | 5/2021 |
| JP | 8-295595 | | * 11/1996 |
| TW | 201638371 | A | 11/2016 |
| TW | I721452 | B | 3/2021 |

* cited by examiner

*Primary Examiner* — Kenneth A Bratland, Jr.
(74) *Attorney, Agent, or Firm* — CKC & Partners Co., LLC

(57) ABSTRACT

A method of single crystal growth includes disposing a polycrystalline source material in a chamber of a single crystal growth apparatus, disposing a seed layer in the chamber of the single crystal growth apparatus, wherein the seed layer is fixed below a lid of the single crystal growth apparatus, heating the polycrystalline source material by a heater of the single crystal growth apparatus to deposit a semiconductor material layer on the seed layer, and after depositing the semiconductor material layer, providing a coolant gas at a backside of the lid to cool down the seed layer and the semiconductor material layer.

15 Claims, 7 Drawing Sheets

METHOD OF SINGLE CRYSTAL GROWTH BY CONTROLLING THE HEATING OF A SOURCE MATERIAL AND THE COOLING OF A BACKSIDE OF A LID

CROSS-REFERENCE TO RELATED APPLICATION

This application claims priority to Taiwan Application Serial Number 110130719, filed Aug. 19, 2021, which is herein incorporated by reference in its entirety.

BACKGROUND

Field of Invention

The present disclosure relates to a method of single crystal growth. More particularly, the present disclosure relates to how to cool down the crystal.

Description of Related Art

Physical vapor transport (PVT) is a technique suitable for growing crystal (such as SiC). During forming a crystalline material or cooling down the crystalline material, thermal stress resulting from the temperature gradient change in the crystal tends to cause different types of defects, such as micro-pipes, basal plane dislocation, threading edge dislocation, etc. These defects may result in a decrease of the yield of semiconductor devices.

SUMMARY

In accordance with some embodiments of the present disclosure, a method of single crystal growth includes disposing a polycrystalline source material in a chamber of a single crystal growth apparatus, disposing a seed layer in the chamber of the single crystal growth apparatus, wherein the seed layer is fixed below a lid of the single crystal growth apparatus, heating the polycrystalline source material by a heater of the single crystal growth apparatus to deposit a semiconductor material layer on the seed layer, and after depositing the semiconductor material layer, providing a coolant gas at a backside of the lid to cool down the seed layer and the semiconductor material layer.

In accordance with some embodiments of the present disclosure, providing the coolant gas at the backside of the lid is such that a temperature gradient of the seed layer is greater than a temperature gradient of the semiconductor material layer.

In accordance with some embodiments of the present disclosure, the method further includes changing a flow rate of the coolant gas.

In accordance with some embodiments of the present disclosure, when the seed layer is cooled down from a first temperature to a second temperature, the flow rate of the coolant gas decreases from a first flow rate to a second flow rate, and when the seed layer is cooled down from the second temperature to a third temperature, the flow rate of the coolant gas decreases from the second flow rate to a third flow rate.

In accordance with some embodiments of the present disclosure, when the seed layer is cooled down from the third temperature to a fourth temperature, the coolant gas has a fourth flow rate higher than the third flow rate.

In accordance with some embodiments of the present disclosure, the method further includes stopping providing the coolant gas when the seed layer is cooled down from the third temperature to a decision temperature.

In accordance with some embodiments of the present disclosure, the single crystal growth apparatus further includes a heat insulation cover over the lid and the heat insulation cover has a plurality of openings, wherein providing the coolant gas at the backside of the lid includes providing the coolant gas from a gas supply to at least one of the openings, such that the coolant gas is flowed in the openings and a gap between the heat insulation cover and the lid.

In accordance with some embodiments of the present disclosure, providing the coolant gas at the backside of the lid further includes moving the gas supply between the openings.

In accordance with some embodiments of the present disclosure, the method further includes blocking the openings of the heat insulation cover before heating the polycrystalline source material by the heater.

In accordance with some embodiments of the present disclosure, the coolant gas includes an inert gas.

In accordance with some embodiments of the present disclosure, the method of single crystal growth includes disposing a polycrystalline source material in a chamber of a single crystal growth apparatus, disposing a seed layer in the chamber of the single crystal growth apparatus, wherein the seed layer is fixed below a lid of the single crystal growth apparatus, heating the polycrystalline source material by a heater of the single crystal growth apparatus to deposit a semiconductor material layer on the seed layer, and after depositing the semiconductor material layer, cooling down a temperature of the chamber by the heater; and during cooling down the temperature of the chamber by the heater, providing a coolant gas at a backside of the lid to cool down the seed layer.

In accordance with some embodiments of the present disclosure, the method further includes changing a temperature provided to the lid by the coolant gas.

In accordance with some embodiments of the present disclosure, when the seed layer is cooled down from a first temperature to a second temperature, the temperature of the coolant gas decreases from a first gas temperature to a second gas temperature, and when the seed layer is cooled down from the second temperature to a third temperature, the temperature of the coolant gas decreases from the second gas temperature to a third gas temperature.

In accordance with some embodiments of the present disclosure, when the seed layer is cooled down from the first temperature to the second temperature, a temperature of the heater decreases from a first heater temperature to a second heater temperature, and when the seed layer is cooled down from the second temperature to the third temperature, the temperature of the heater decreases from the second heater temperature to a third heater temperature, a decreasing rate from the second gas temperature to the third gas temperature corresponds with a decreasing rate from the second heater temperature to the third heater temperature.

In accordance with some embodiments of the present disclosure, when the seed layer is cooled down from the third temperature to a fourth temperature, the temperature of the coolant gas decreases from the third gas temperature to a fourth temperature.

In accordance with some embodiments of the present disclosure, the seed layer is cooled down from the third temperature to a decision temperature then to the fourth temperature, and after the seed layer is cooled down to the decision temperature, a decreasing rate of the temperature of the coolant gas to the fourth gas temperature is faster than a decreasing rate from the second gas temperature to the third gas temperature.

In accordance with some embodiments of the present disclosure, the coolant gas is stopped providing to the lid when the seed layer is cooled down to a decision temperature.

In accordance with some embodiments of the present disclosure, when the seed layer is cooled down to the decision temperature, the heater is shut down to accelerate a decrease of the temperature of the chamber.

In accordance with some embodiments of the present disclosure, the method further includes preheating the coolant gas before providing the coolant gas.

In accordance with some embodiments of the present disclosure, a temperature provided to the lid by the coolant gas remains a constant during cooling down the temperature of the chamber by the heater.

Some embodiments of the present disclosure provide some advantages. Using the coolant gas provided at the backside of the lid can make the temperature gradient of the seed layer and the portion of the semiconductor material layer increase. As such, defects which are formed due to internal stress are easily formed at the seed layer and in the portion of the semiconductor material layer near the seed layer, such that the defects do not extend downwards to the semiconductor material layer to destroy uniformity of the single crystal in the semiconductor material layer.

It is to be understood that both the foregoing general description and the following detailed description are by examples, and are intended to provide further explanation of the description as claimed.

BRIEF DESCRIPTION OF THE DRAWINGS

FIGS. 2-4A illustrate intermediate stages of the single crystal growth process in accordance with some embodiments of the present disclosure.

FIG. 4B illustrates the temperature distribution of the single crystal growth apparatus in FIG. 4A.

DETAILED DESCRIPTION

Some embodiments of the present disclosure may reduce defects in crystals to be grown. More specifically, some embodiments of the present disclosure cool down a portion of the crystal region by a cooling gas provided at the backside of the crystal during the cooling period of the crystal after the crystal growth process. The defects in the crystal can be constrained near a seed layer. As such, the defects resulting from the internal stress will not extend throughout the crystal.

Figure 1:
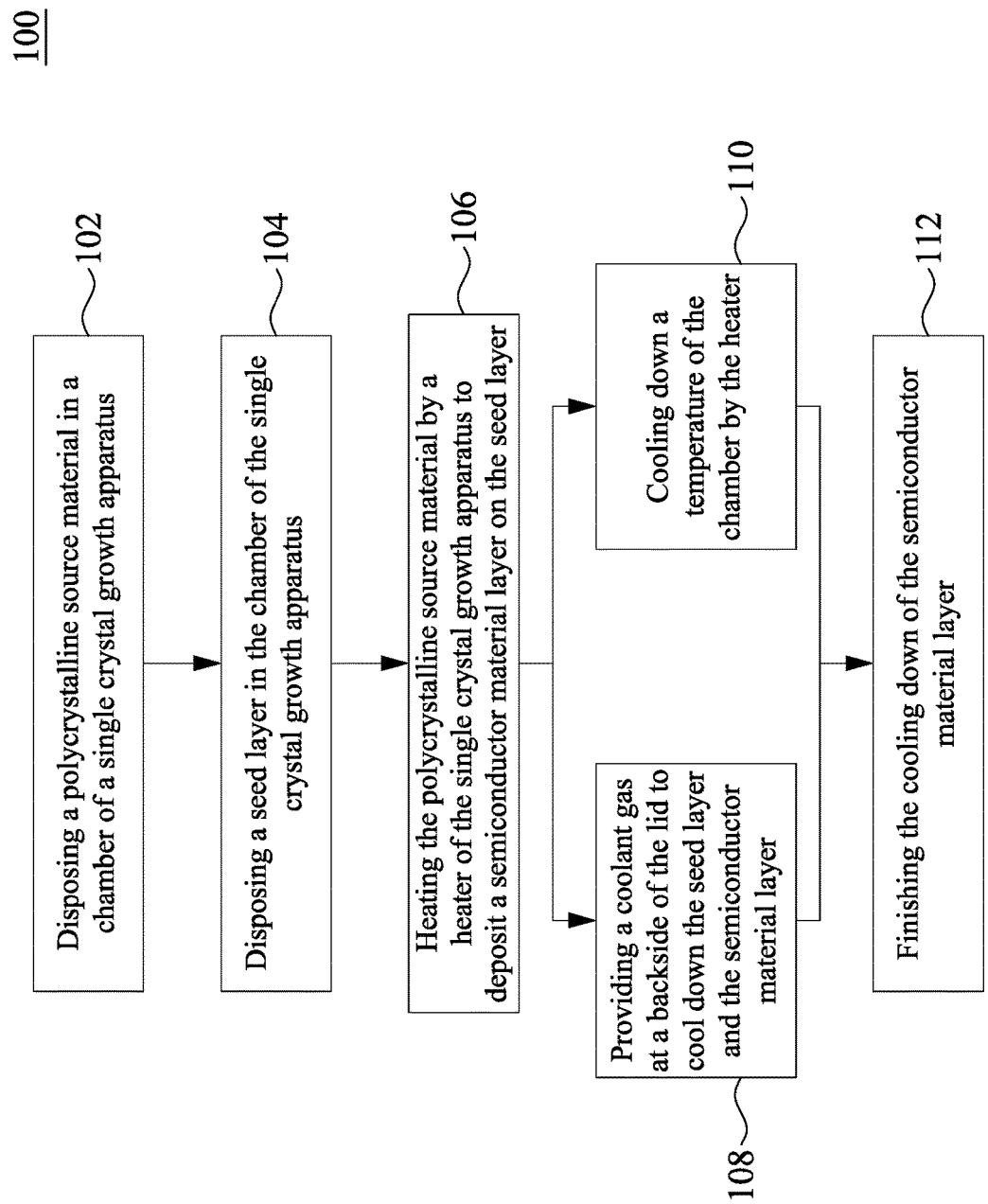
FIG. 1 illustrates a flow chart of a single crystal growth process in accordance with some embodiments of the present disclosure.

FIG. 1 illustrates a flow chart of a single crystal growth process 100 in accordance with some embodiments of the present disclosure. It is noted that the sequences of processes mentioned in these embodiments are able to be adjusted based on the practical needs, unless the sequences are particularly stated. The processes can even be performed at the same time or partially at the same time. In operation 102 of the process 100, a polycrystalline source material is disposed in a chamber of a single crystal growth apparatus. In some embodiments, the single crystal growth apparatus is the single crystal growth apparatus 200 shown in FIG. 2. In some embodiments, the single crystal growth apparatus 200 is a physical vapor transport (PVT) apparatus.

Figure 2:
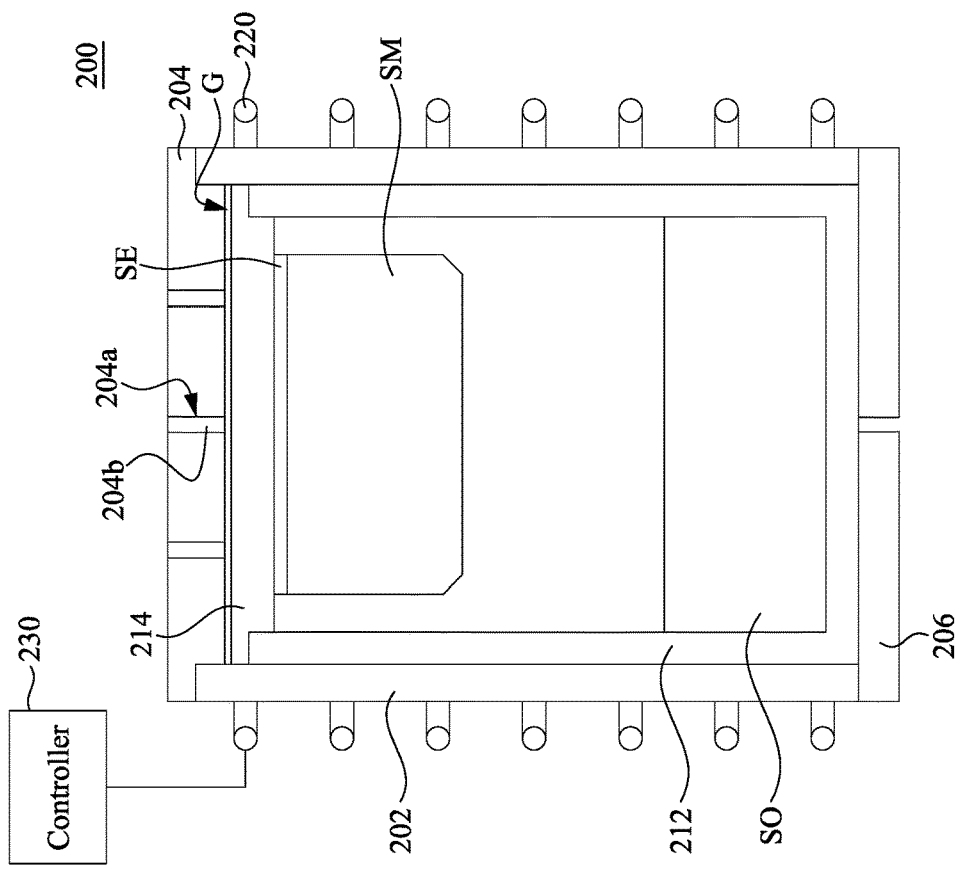

FIG. 2 illustrates an intermediate stage of the single crystal growth process 100 in accordance with some embodiments of the present disclosure. A shell of the single crystal growth apparatus 200 may include a sidewall 202, a heat insulation cover 204 and a base 206. The sidewall 202, the heat insulation cover 204 and the base 206 are made of thermal insulating material, such that the crystal inside (i.e. the semiconductor material layer SM in FIG. 3) can be formed under high temperature and is not affected by the environmental temperature. The heat insulation cover 204 includes a plurality of openings 204a for introducing a coolant gas in the subsequent cooling process. In some embodiments, a cover 204b (such as a plug or a moveable cover) may be placed in the openings 204a to provide thermal insulation during heating of the single crystal growth. A crucible 212 and a lid 214 used for providing a single crystal growth space are placed inside the shell, and the lid 214 is below the heat insulation cover 204. The crucible 212 and the lid 214 are made of refractory materials, such as graphite or other suitable materials. In some embodiments, the bearing temperature of the crucible 212 and the lid 214 may reach to about 2800° C. A heater 220 wraps around the shell of the single crystal growth apparatus 200. For example, the heater 220 may spirally wrap around the shell of the single crystal growth apparatus 200. Hence, FIG. 2 illustrates cross-sections of the spiral heater 220. The single crystal growth apparatus 200 may further include a controller 230 connected with the heater 220. During the single crystal growth, the heater 220 is controlled by the controller 230 to provide the desired heat energy. Moreover, the temperature of the heater 220 and the increasing/decreasing rate of the temperature may be adjusted by using the controller 230 according to different situations.

A polycrystalline source material SO is placed in the chamber of the crucible 212. The polycrystalline source material SO is a solid, such as powders. The type of the polycrystalline source material SO is chosen based on the crystal to be grown. For example, in a situation where silicon carbide (SiC) is to be grown, the polycrystalline source material SO is mainly made of SiC.

Next, turning back to FIG. 1, in operation 104 of the process 100, a seed layer is disposed in the chamber of the single crystal growth apparatus. A seed layer SE is fixed below the lid 214 of the single crystal growth apparatus 200 and faces the chamber inside the crucible 212. In some embodiments, the seed layer SE is made of the same material as the polycrystalline source material SO. For example, when the polycrystalline source material SO is made of SiC, the seed layer SE is also a single crystalline material made of SiC.

Figure 3:
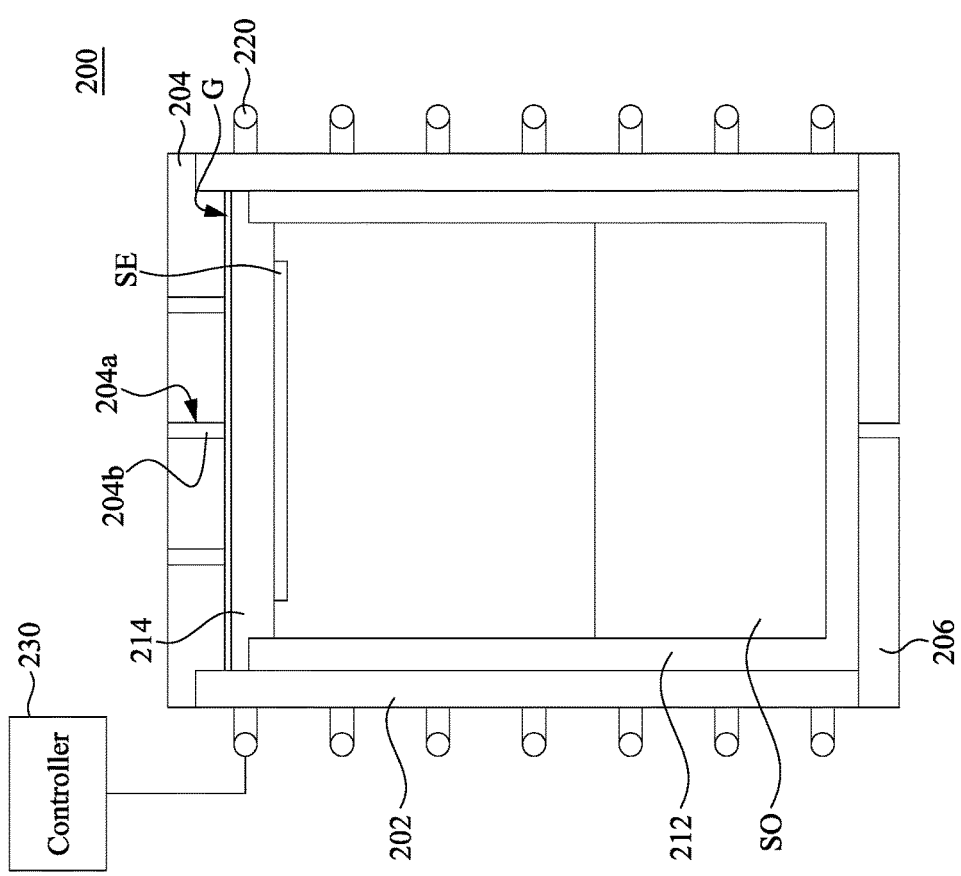

Next, turning back to FIG. 1, in operation 106 of the process 100, the polycrystalline source material is heated by a heater of the single crystal growth apparatus to deposit a semiconductor material layer on the seed layer. Specifically, as shown in FIG. 3, after the polycrystalline source material SO and the seed layer SE are in place, the controller 230 may be used to control the heater 220 to heat the polycrystalline source material SO. During heating, the temperature of the lower portion of the chamber of the crucible 212 is higher than the temperature near the lid 214. After the temperature of the lower portion of the chamber of the crucible 212 reaches the sublimation point of the polycrystalline source material SO, the polycrystalline source material SO sublimates into gas. The sublimation gas moves to the seed layer SE below the lid 214 at lower temperature, and a semiconductor material layer SM is deposited on the seed layer SE. In some embodiments, the covers 204b block the openings 204a to provide good thermal insulation before heating the polycrystalline source material SO. In some embodiments, if the polycrystalline source material SO is SiC, during the growth of the semiconductor material layer SM, the temperature of the polycrystalline source material SO is in a range from about 2300° C. to about 2800° C.

Figures 4A, 4B:
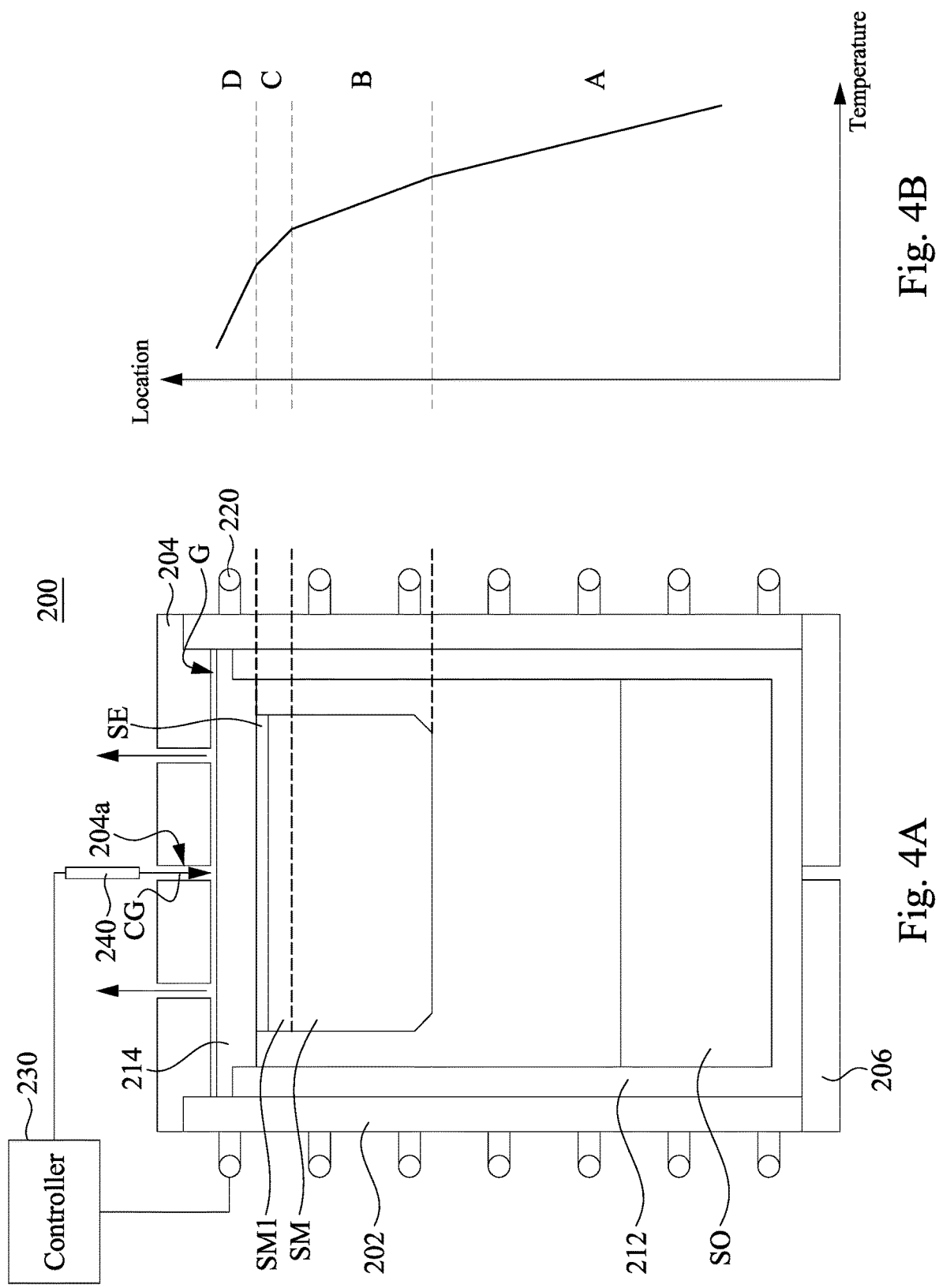

After the deposition of the semiconductor material layer SM, turning back to FIG. 1, in operation 108 of the process 100, a coolant gas is provided at a backside of the lid to cool down the seed layer and the semiconductor material layer. Related details are shown in FIG. 4A. In detail, the single crystal growth apparatus 200 further includes a gas supply 240 to provide a coolant gas CG to the lid 214. The controller 230 may be further connected with the gas supply 240 to control parameters (such as flow rate and/or temperature of the coolant gas CG) of the coolant gas CG provided at the backside of the lid 214. The coolant gas CG is provided from the gas supply 240 to the single crystal growth apparatus 200.

During cooling down the semiconductor material layer SM, uniformity of the temperature gradient change in the semiconductor material layer SM causes internal stress, such that crystal defects are formed. These defects lower the quality of the single crystal. Therefore, some embodiments of the present disclosure provide the coolant gas CG at the backside of the lid 214 to cool down the seed layer SE and a portion SM1 of the semiconductor material layer SM near the seed layer SE to increase the temperature gradient of the portion SM1. Hence, the internal stress in the semiconductor material layer SM is reduced to prevent formation of or growth of defects in the semiconductor material layer SM. Specifically, the covers 204b (see FIG. 3) in the openings 204a may be first removed, and then the coolant gas CG is introduced from the gas supply 240 through some openings 204a in the heat insulation cover 204 over the lid 214. The coolant gas CG makes the temperature of the seed layer SE and the portion SM1 of the semiconductor material layer SM near the seed layer SE decrease. The temperature decreasing gradient of the seed layer SE and the portion SM1 of the semiconductor material layer SM increases, such that internal stress and defects tends to concentratedly form in the seed layer SE and the portion SM1 of the semiconductor material layer SM and are not easy to keep growing downwards to damage the structure of the semiconductor material layer SM. In some embodiments, defects only form in the seed layer SE and do not keep growing downwards into the semiconductor material layer SM, or defects do not directly form in the semiconductor material layer SM due to internal stress.

In some embodiments, the heat insulation cover 204 and the lid 214 have gaps G therebetween, such that the coolant gas CG may flow within these gaps G to cool down the seed layer SE and the portion SM1 of the semiconductor material layer SM. The coolant gas CG then leaves the single crystal growth apparatus 200 from other openings 204a. In some embodiments, because the lid 214 is made of graphite material, the upper surface of the lid 214 may be rough. When the heat insulation cover 204 is against the lid 214 (i.e. the heat insulation cover 204 is directly in contact with the lid 214), a portion of the rough upper surface of the lid 214 not directly in contact with the heat insulation cover 204 forms the gaps G and the coolant gas CG may flow within the gaps G. In some other embodiments, the heat insulation cover 204 is not in contact with the lid 214, so the gap G forms between the heat insulation cover 204 and the lid 214. In yet some other embodiments, the bottom surface of the heat insulation cover 204 is designed with recesses connecting with the openings 204, and these recesses are gaps G.

In some embodiments, in order to increase the cooling efficiency of the seed layer SE and the portion SM1 of the semiconductor material layer SM, the coolant gas CG is provided only at the backside of the lid 214 and does not flow within other portion (such as inside the sidewall 202) of the single crystal growth apparatus 200. For example, the coolant gas CG does not pass by the heater 220, i.e. the path of the coolant gas CG is separated from the heater 220 (such as separated by the sidewall 202). As such, the coolant gas CG may mainly cool down the seed layer SE, and the heater 220 may mainly cool down the semiconductor material layer SM. Such configuration can independently control the temperature gradient of the seed layer SE and the semiconductor material layer SM respectively. Therefore, the temperature of the seed layer SE and the portion SM1 of the semiconductor material layer SM may significantly decrease, and the temperature gradient in the seed layer SE and the portion SM1 of the semiconductor material layer SM may effectively increase (discussed in detail in FIG. 4B), such that defects are more easily to remain or form in the seed layer SE and the portion SM1 of the semiconductor material layer SM.

FIG. 4B illustrates the temperature distribution of the single crystal growth apparatus 200 in FIG. 4A. The temperature of the single crystal growth apparatus 200 decreases as being farther away from the polycrystalline source material SO, and the temperature distribution may be divided into region A, region B, region C and region D by a different temperature gradient. The region A is a temperature gradient from the polycrystalline source material SO to the bottom of the semiconductor material layer SM. The region B is a temperature gradient from the bottom of the semiconductor material layer SM to the bottom of the portion SM1 of the semiconductor material layer SM. The region C is a temperature gradient from the bottom of the portion SM1 of the semiconductor material layer SM to the top portion of the seed layer SE. The region D is a temperature gradient within the lid 214. Providing the coolant gas CG to the backside of the lid 214 makes the temperature gradient of the seed layer SE greater than the temperature gradient of the semiconductor material layer SM. The temperature gradient of the seed layer SE is temperature variation along the location change of the crystal growth direction in the region C of FIG. 4B. The temperature gradient of the semiconductor material layer SM is temperature variation along the location change of the crystal growth direction in the region B of FIG. 4B. In some embodiments, the temperature gradient of the seed layer SE also includes the temperature gradient of the portion SM1 of the semiconductor material layer SM. The coolant gas CG provided at the backside of the lid 214 can change the temperature distribution of the region C. Specifically, when there is no coolant gas CG provided at the backside of the lid 214, cooling rate of the seed layer SE and the portion SM1 of the semiconductor material layer SM (the region C) is slower, such that difference between the temperature gradient of the seed layer SE and the portion SM1 of the semiconductor material layer SM (the region C) and the temperature gradient of the semiconductor material layer SM (the region B) is small (such as substantially the same). Stated another way, slopes of the temperature distribution of the region B and the region C are about the same. On the other hand, when the coolant gas CG is provided at the backside of the lid 214, cooling rate of the seed layer SE and the portion SM1 of the semiconductor material layer SM increases due to convection provided from the coolant gas CG, such that the temperature gradient of the region C increases. However, convection provided by the coolant gas CG only affects the portion near the lid 214. Therefore, the temperature gradient of the region B with the coolant gas CG does not substantially change or only slightly changes compared to the region B without the coolant gas CG. Increasing the temperature gradient in the region C leads to defects, which are typically formed due to stress concentration, more easily kept in the region C and prevents defects from extending into the region B. As such, the amount of overall defects of the semiconductor material layer SM may be reduced.

In some embodiments, because the temperature of the semiconductor material layer SM and the seed layer SE is high right after the single crystal growth, the coolant gas CG may be preheated before providing the coolant gas CG to prevent from adverse effect to the semiconductor material layer SM and the seed layer SE caused by the coolant gas CG at excessively low temperature. The preheating temperature of the coolant gas CG may be decided based on desired temperature gradient (such as the region C shown in FIG. 4B). For example, in some embodiments, the temperature of the seed layer SE right after single crystal growth is in a range from about 2200° C. to about 2300° C., then the preheating temperature of the coolant gas CG is in a range from about 1400° C. to about 2100° C.

Figure 6:
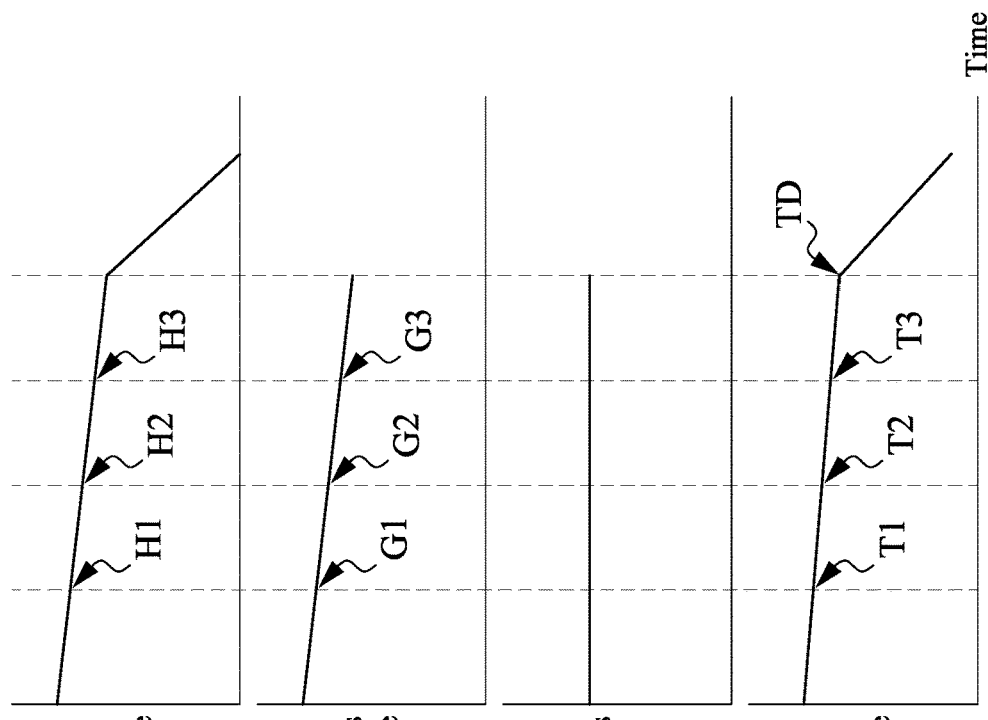
FIG. 5 and FIG. 6 illustrate adjustable apparatus parameters during the cooling down of the semiconductor material layer in accordance with some embodiments of the present disclosure.
Figure 5:
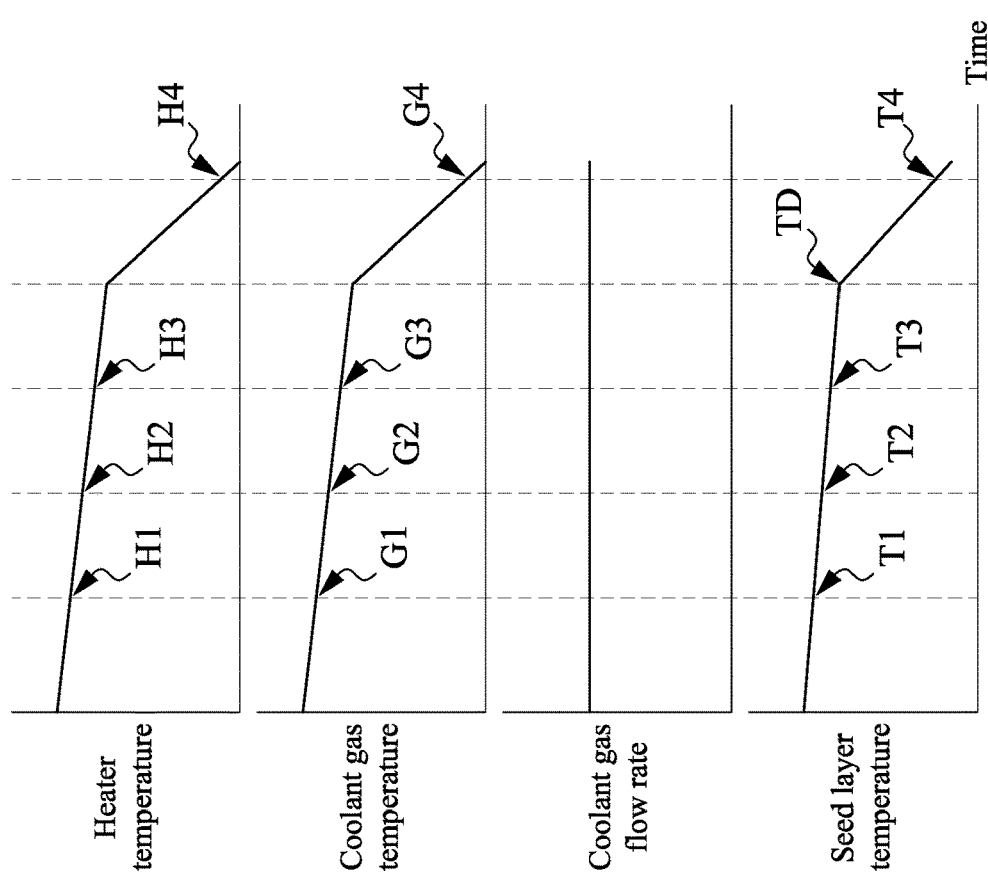

Turning back to FIG. 1, at the same time of performing operation 108 of the process 100, operation 110 is performed to cool down the temperature of the chamber by the heater to cool down the semiconductor material layer SM. FIG. 5 and FIG. 6 illustrate adjustable apparatus parameters during the cooling down of the semiconductor material layer SM in accordance with some embodiments of the present disclosure. In some embodiments, temperature of the heater 220, temperature and flow rate of the coolant gas CG may be adjusted to cool down the seed layer SE. For example, as shown in FIG. 5 and FIG. 6, the temperature provided to the lid 214 by the coolant gas CG may be adjusted based on the temperature of the heater 220. During the cooling, the temperature of the coolant gas CG is always lower than the temperature of the seed layer SE. The seed layer SE is cooled down from a first temperature T1 to a second temperature T2 then to a third temperature T3, the temperature of the heater 220 decreases from a first heater temperature H1 to a second heater temperature H2 then to a third heater temperature H3, and the temperature of the coolant gas CG decreases from a first gas temperature G1 to a second gas temperature G2 then to a third gas temperature G3. That is, during continuous cooling down the seed layer SE, the temperature of the heater 220 and the temperature of the coolant gas CG keep decreasing. In some embodiments, a decreasing rate from the second gas temperature G2 to the third gas temperature G3 corresponds with the decreasing rate from the second heater temperature H2 to the third heater temperature H3. The term "correspond with" herein means that the decreasing rate of the temperature of the heater 220 is related to the decreasing rate of the temperature of the coolant gas CG. For example, because the coolant gas CG only substantially affects the temperature of the seed layer SE, the decreasing rate from the second gas temperature G2 to the third gas temperature G3 may be slightly faster than the decreasing rate from the second heater temperature H2 to the third heater temperature H3. The difference between the temperature of the coolant gas CG and the temperature of the heater 220 decides the temperature gradient of the region C along with a change of the cooling time and also affects the temperature difference between the coolant gas CG and the seed layer SE. Therefore, capability of removing heat by the coolant gas may be adjusted along with the cooling time based on desired temperature gradient of the region C. In some embodiments, the coolant gas CG includes inert gases (such as nitrogen or argon).

After the seed layer SE is cooled down to a decision temperature TD, the temperature of the seed layer SE at this time does not affect the formation of defects or slightly affects the formation of defects. Therefore, the temperature decreasing rate of the heater 220 may increase at this time. In some embodiments, the heater 220 may be shut down to increase the temperature decreasing rate of the heater 220 to accelerate the decrease of the temperature of the chamber inside the crucible 212 (i.e. after the seed layer SE is cooled down to the decision temperature TD, temperature decreasing rate of the heater 220 to the fourth heater temperature H4 becomes faster). At this stage, the temperature decreasing rate of the coolant gas CG cooperates with the temperature decreasing rate of the heater 220. Because the temperature decreasing rate of the heater 220 and the temperature decreasing rate of the coolant gas CG increase, the cooling rate of the seed layer SE also increases. For example, in FIG. 5, when the seed layer SE is cooled down from the third temperature T3 to the decision temperature TD then to a fourth temperature T4, the coolant gas CG is at a fourth gas temperature G4 lower than the third gas temperature G3 and the cooling rate is faster than the decreasing rate from the second gas temperature G2 to the third gas temperature G3. In some embodiments shown as FIG. 5, the flow rate of the coolant gas CG remains constant throughout the cooling of the semiconductor material layer SM. In some embodiments, the decision temperature TD is in a range from about 1000° C. to about 1800° C. In some embodiments, as shown in FIG. 6, after the seed layer SE is cooled down to the decision temperature TD, the coolant gas CG may be stopped providing.

Turning back to FIG. 1, in operation 112 of the process 100, after the semiconductor material layer SM is cooled down to an acceptable temperature, such as room temperature, the cooling of the semiconductor material layer SM is finished.

Figure 7:
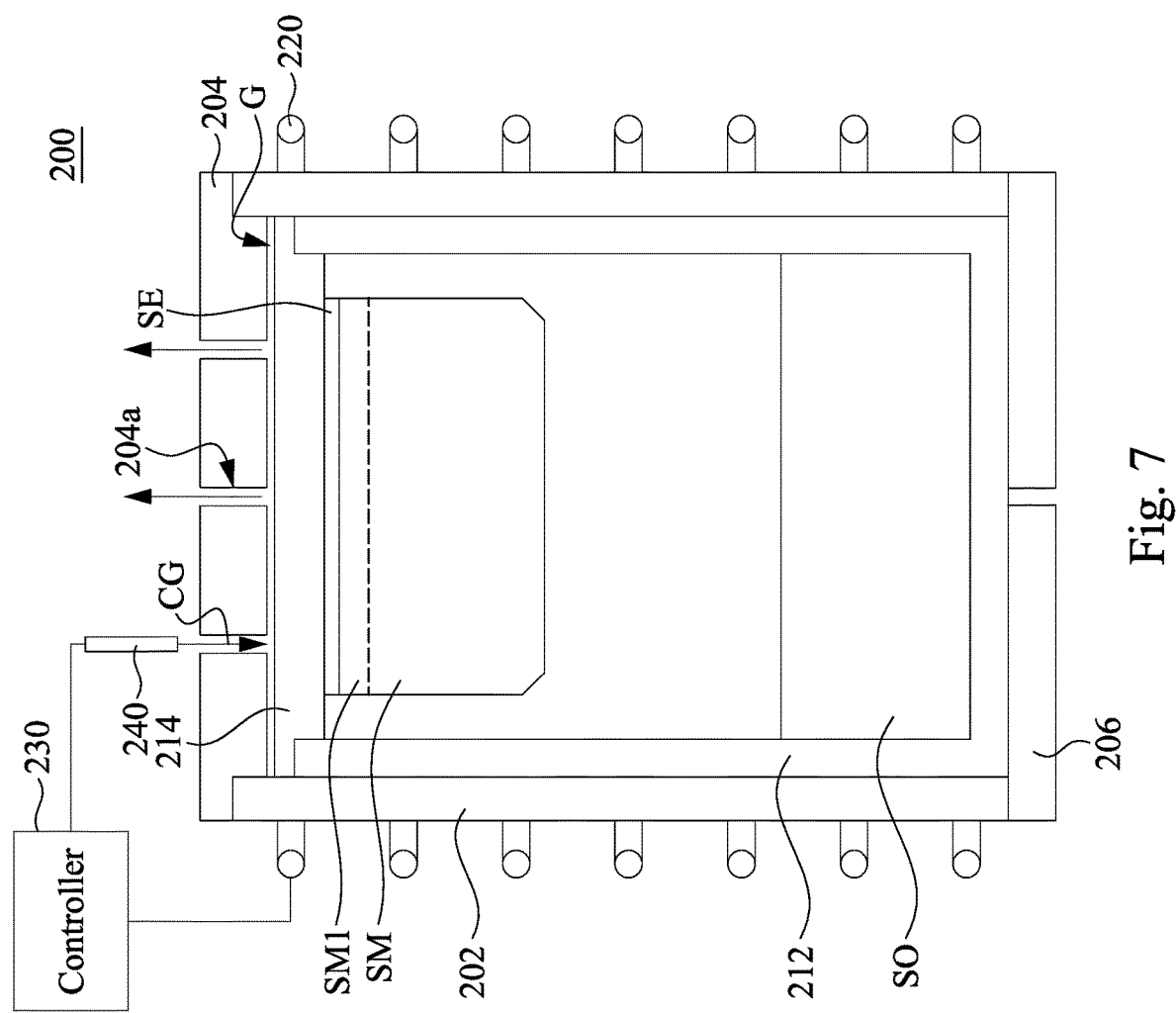
FIG. 7 illustrates the intermediate stage of the single crystal growth process in accordance with some embodiments of the present disclosure.

Referring to FIG. 7, in some embodiments, the gas supply 240 may be moved between the openings 204a. For example, the gas supply 240 is moved from a center of the heat insulation cover 204 in FIG. 4A to an edge of the heat insulation cover 204 in FIG. 7. The gas supply 240 is moved or the number of the gas supply 240 is increased based on different situations, such as temperature at different locations of the seed layer SE. As such, uniformity of cooling of the seed layer SE may be increased to prevent the significant difference between internal stress of the seed layer SE affecting the semiconductor material layer SM.

The method of cooling down the seed layer SE is not limited to FIG. 5 and FIG. 6. FIGS. 8-11 illustrate adjustable parameters during the cooling down of the seed layer SE in accordance with some other embodiments of the present disclosure.

Figure 9:
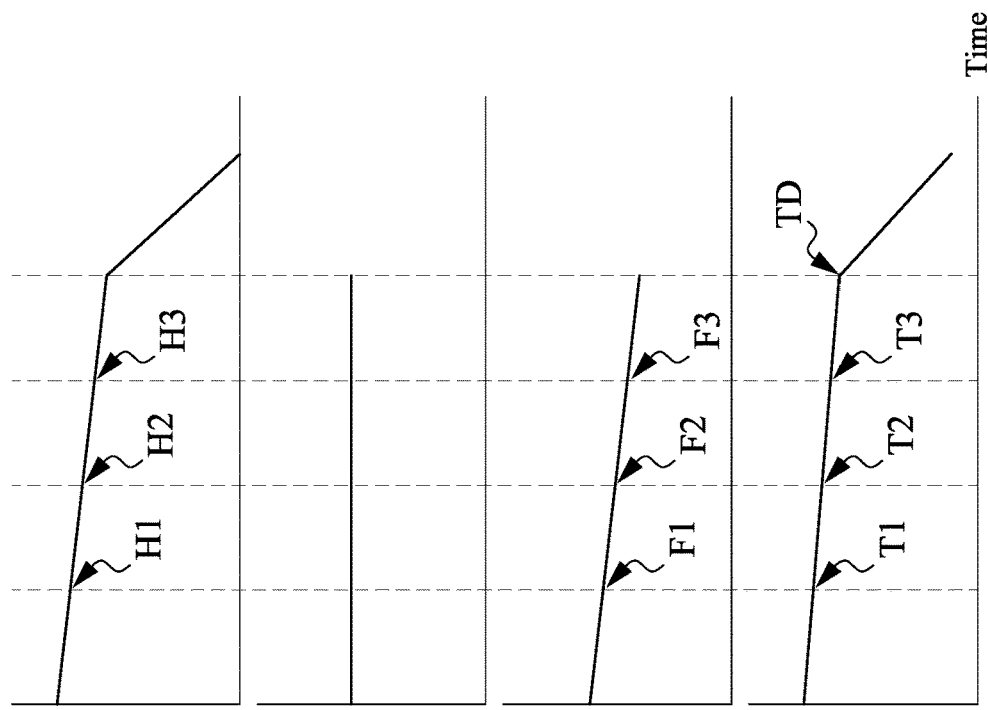
FIGS. 8-11 illustrate adjustable apparatus parameters during the cooling down of the semiconductor material layer SM in accordance with some other embodiments of the present disclosure.
Figure 8:
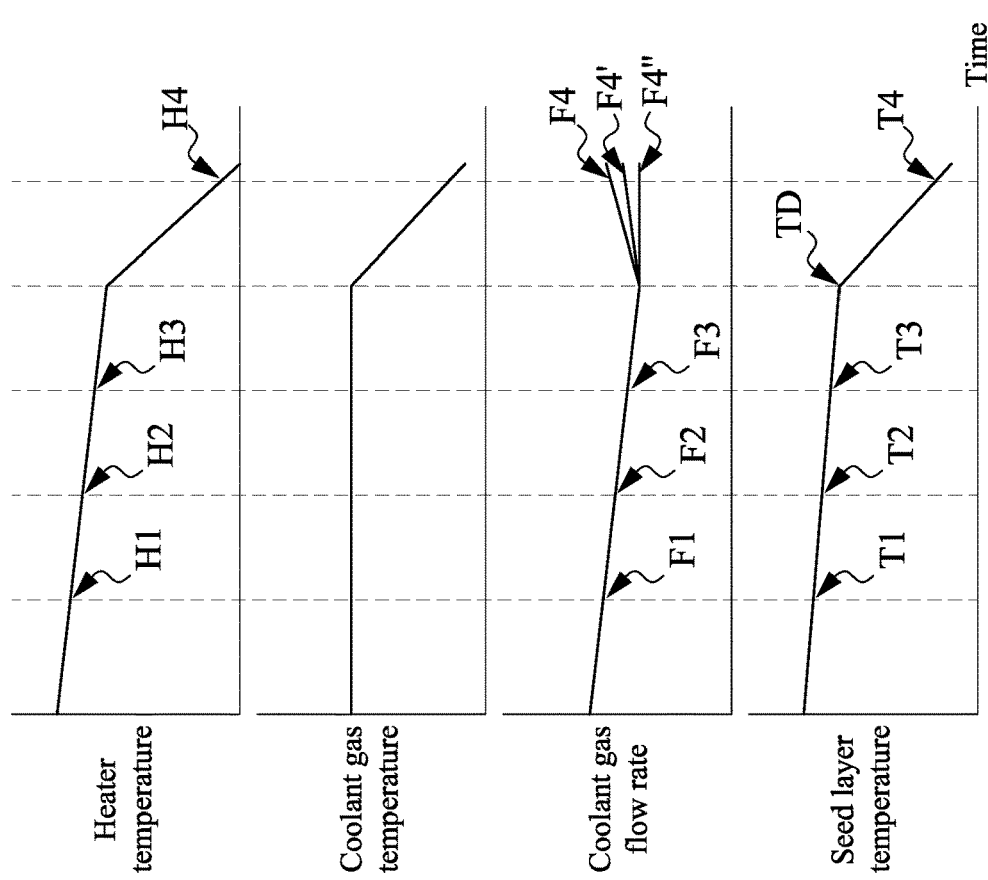

In some embodiments, before the seed layer SE is cooled down to the decision temperature TD, the temperature of the coolant gas CG may not be adjusted, as shown in FIG. 8 and FIG. 9. Stated another way, during decreasing the chamber temperature by the heater 220, the temperature provided to the lid 214 by the coolant gas CG remains a constant value, and the controller 230 adjusts the flow rate of the coolant gas CG to be lower and lower. After the seed layer SE is cooled down to the decision temperature TD, the flow rate of the coolant gas CG may be increased and the temperature of the coolant gas CG may be decreased for removal of heat of the seed layer SE. For example, at the beginning of the cooling (i.e. operations 108 and 110), the seed layer SE is at a higher temperature, so the coolant gas CG with higher flow rate may be used to cool down the seed layer SE. At the point the temperature of the seed layer SE decreases (such as decreases to the third temperature T3), the flow rate of the coolant gas CG may be slowed down to control the cooling rate of the seed layer SE, preventing the seed layer SE from cooling too fast, which will cause defects forming in the semiconductor material layer SM. After the seed layer SE is cooled down to the decision temperature TD, defects are not easily formed in the semiconductor material layer SM below the decision temperature TD, so the semiconductor material layer SM may be cooled down more quickly.

Take FIG. 8 and FIG. 9 as examples. When the seed layer SE is cooled down from the first temperature T1 to the second temperature T2 then to the third temperature T3, the flow rate of the coolant gas CG decreases from a first flow rate F1 to a second flow rate F2 and then to a third flow rate F3. In addition, in FIG. 8, when the seed layer SE is cooled down to the fourth temperature T4 below the decision temperature TD, the coolant gas CG has a fourth flow rate F4 higher than the third flow rate F3; or a fourth flow rate F4' close to the third flow rate F3; or a fourth flow rate F4" lower than the third flow rate F3 (i.e. the flow rate of the coolant gas CG is unchanged). The adjustable apparatus parameters in FIG. 9 are similar to FIG. 8. The difference is that after the seed layer SE is cooled down to the decision temperature TD, the coolant gas CG may be stopped providing.

Figure 11:
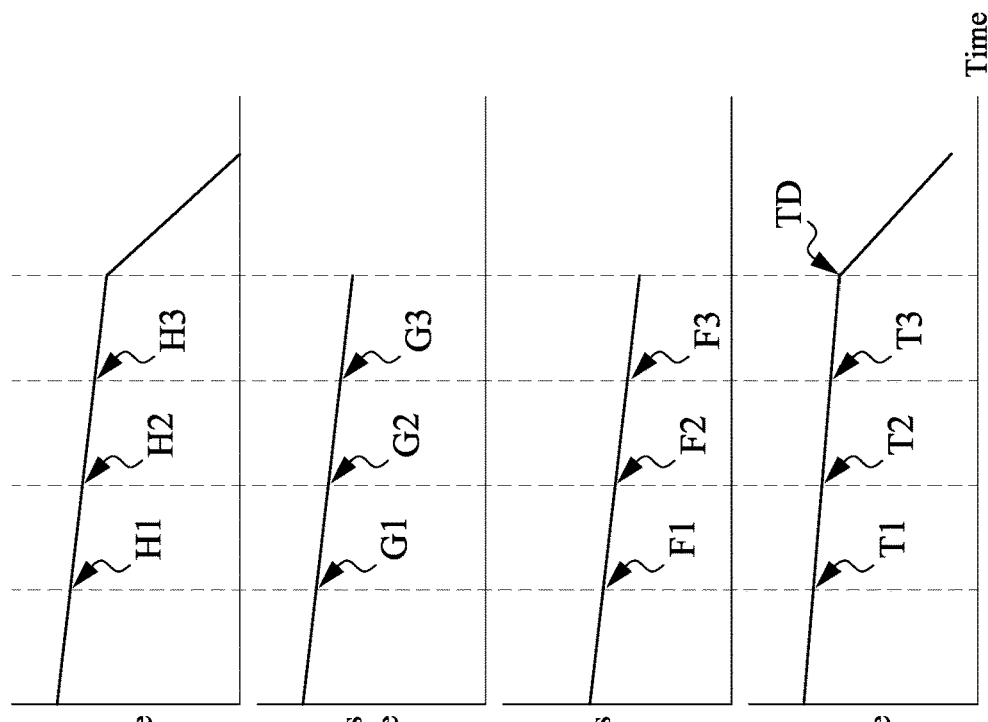
Figure 10:
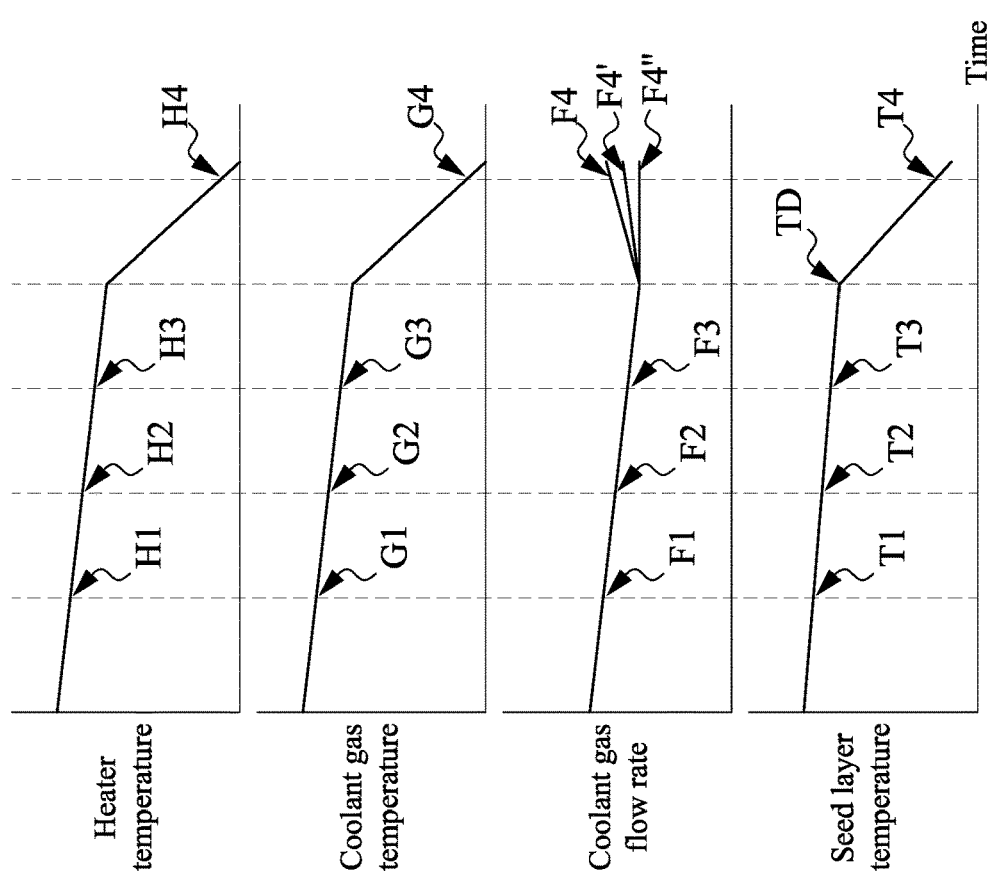

In some embodiments, before the seed layer SE is cooled down to the decision temperature TD, the temperature of the heater 220, the temperature and the flow rate of the coolant gas CG may be decreased at the same time, as shown in FIG. 10 and FIG. 11. In FIG. 10, the way of adjusting the temperature of the coolant gas CG may be similar to the embodiments in FIG. 5, and the way of adjusting the flow rate of the coolant gas CG may be similar to the embodiments in FIG. 8. The adjustable apparatus parameters in FIG. 11 are similar to FIG. 10. The difference is that after the seed layer SE is cooled down to the decision temperature TD, the coolant gas CG may be stopped providing.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A method of single crystal growth, comprising:
disposing a polycrystalline source material in a chamber of a single crystal growth apparatus, wherein the single crystal growth apparatus comprises a lid and a heat insulation cover over the lid, and the heat insulation cover has a plurality of openings;
disposing a seed layer in the chamber of the single crystal growth apparatus, wherein the seed layer is fixed below a lid of the single crystal growth apparatus;
heating the polycrystalline source material by a heater of the single crystal growth apparatus to deposit a semiconductor material layer on the seed layer; and
after depositing the semiconductor material layer, providing a coolant gas at a backside of the lid to cool down the seed layer and the semiconductor material layer, wherein providing the coolant gas at the backside of the lid comprises providing the coolant gas from a gas supply to at least one of the openings, such that the coolant gas flows in the openings and a gap between the heat insulation cover and the lid.

2. The method of claim 1, wherein providing the coolant gas at the backside of the lid is such that a temperature gradient of the seed layer is greater than a temperature gradient of the semiconductor material layer.

3. The method of claim 1, further comprising changing a flow rate of the coolant gas.

4. The method of claim 3, wherein when the seed layer is cooled down from a first temperature to a second temperature, the flow rate of the coolant gas decreases from a first flow rate to a second flow rate, and when the seed layer is cooled down from the second temperature to a third temperature, the flow rate of the coolant gas decreases from the second flow rate to a third flow rate.

5. The method of claim 4, wherein when the seed layer is cooled down from the third temperature to a fourth temperature, the coolant gas has a fourth flow rate higher than the third flow rate.

6. The method of claim 4, further comprising:
stopping providing the coolant gas when the seed layer is cooled down from the third temperature to a decision temperature.

7. The method of claim 1, wherein providing the coolant gas at the backside of the lid further comprises:
moving the gas supply between the openings.

8. The method of claim 1, further comprising:
blocking the openings of the heat insulation cover before heating the polycrystalline source material by the heater.

9. The method of claim 1, wherein the coolant gas comprises an inert gas.

10. A method of single crystal growth, comprising:
disposing a polycrystalline source material in a chamber of a single crystal growth apparatus;
disposing a seed layer in the chamber of the single crystal growth apparatus, wherein the seed layer is fixed below a lid of the single crystal growth apparatus;
heating the polycrystalline source material by a heater of the single crystal growth apparatus to deposit a semiconductor material layer on the seed layer;
after depositing the semiconductor material layer, cooling down a temperature of the chamber by the heater; and
during cooling down the temperature of the chamber by the heater, providing a coolant gas at a backside of the lid to cool down the seed layer, wherein when the seed layer is cooled down from a first temperature to a second temperature, the temperature of the coolant gas decreases from a first gas temperature to a second gas temperature, and when the seed layer is cooled down from the second temperature to a third temperature, the temperature of the coolant gas decreases from the second gas temperature to a third gas temperature, when the seed layer is cooled down from the first temperature to the second temperature, a temperature of the heater decreases from a first heater temperature to a second heater temperature, and when the seed layer is cooled down from the second temperature to the third temperature, the temperature of the heater decreases from the second heater temperature to a third heater temperature, a decreasing rate from the second gas temperature to the third gas temperature corresponds with a decreasing rate from the second heater temperature to the third heater temperature.

11. The method of claim 10, wherein when the seed layer is cooled down from the third temperature to a fourth temperature, the temperature of the coolant gas decreases from the third gas temperature to a fourth gas temperature.

12. The method of claim 11, wherein the seed layer is cooled down from the third temperature to a decision temperature then to the fourth temperature, and after the seed layer is cooled down to the decision temperature, a decreasing rate of the temperature of the coolant gas to the fourth gas temperature is faster than a decreasing rate from the second gas temperature to the third gas temperature.

13. The method of claim 10, wherein the coolant gas is stopped providing to the lid when the seed layer is cooled down to a decision temperature.

14. The method of claim 13, wherein when the seed layer is cooled down to the decision temperature, the heater is shut down to accelerate a decrease of the temperature of the chamber.

15. The method of claim 10, further comprising preheating the coolant gas before providing the coolant gas.

* * * * *